(12) United States Patent
Moon

(10) Patent No.: US 10,734,536 B2
(45) Date of Patent: Aug. 4, 2020

(54) COMPOSITION FOR FORMING ELECTRODE, ELECTRODE MANUFACTURED USING THE SAME AND SOLAR CELL

(71) Applicant: SAMSUNG SDI CO., LTD., Yongin-si, Gyeonggi-do (KR)

(72) Inventor: Sungil Moon, Suwon-si (KR)

(73) Assignee: Samsung SDI Co., Ltd., Yongin-Si, Gyeonggi-do (KR)

(*) Notice: Subject to any disclaimer, the term of this patent is extended or adjusted under 35 U.S.C. 154(b) by 36 days.

(21) Appl. No.: 15/791,526

(22) Filed: Oct. 24, 2017

(65) Prior Publication Data

US 2018/0269342 A1  Sep. 20, 2018

(30) Foreign Application Priority Data

Mar. 16, 2017 (KR) .......................... 10-2017-0033217

(51) Int. Cl.
*H01L 31/0224* (2006.01)
*C08G 81/02* (2006.01)
*C08G 81/00* (2006.01)

(52) U.S. Cl.
CPC ...... *H01L 31/022425* (2013.01); *C08G 81/00* (2013.01); *C08G 81/02* (2013.01); *Y02E 10/50* (2013.01)

(58) Field of Classification Search
None
See application file for complete search history.

(56) References Cited

U.S. PATENT DOCUMENTS

| 2006/0099328 A1 | 5/2006 | Waite et al. |
| 2010/0294353 A1 | 11/2010 | Takahashi |
| 2014/0024824 A1 | 1/2014 | Tanaka et al. |

FOREIGN PATENT DOCUMENTS

| CN | 102332322 A | 1/2012 |
| CN | 102522140 A | 6/2012 |
| CN | 102639567 A | 8/2012 |

(Continued)

OTHER PUBLICATIONS

Taiwanese the Search Report dated Oct. 24, 2018, which was attached to the Notice of Allowance dated Oct. 31, 2018, of the corresponding Taiwanese Patent Application No. 106138837.

(Continued)

*Primary Examiner* — Shannon M Gardner
(74) *Attorney, Agent, or Firm* — Lee IP Law, PC

(57) ABSTRACT

A composition for forming an electrode for a solar cell includes a conductive powder, a glass fit, and an organic binder that includes a cellulose compound that includes a structural unit represented by Chemical Formula 1,

[Chemical Formula 1]

Also disclosed are a solar cell electrode manufactured using the composition for forming an electrode for a solar cell, and a solar cell including the electrode.

14 Claims, 1 Drawing Sheet

(56) References Cited

FOREIGN PATENT DOCUMENTS

| | | |
|---|---|---|
| CN | 103025815 A | 4/2013 |
| JP | 11-349601 A | 12/1999 |
| JP | 3233924 B2 | 12/2001 |
| JP | 5040053 B2 | 10/2012 |
| KR | 10-0691366 B1 | 2/2007 |
| KR | 10-2015-0071713 A | 6/2015 |
| KR | 10/2016-0128098 | 11/2016 |
| KR | 10-2017-0024416 | 3/2017 |
| TW | 201638974 A | 11/2016 |
| TW | 201708374 A | 3/2017 |
| WO | WO-2018112743 A1 * | 6/2018 ............... C09D 5/24 |

OTHER PUBLICATIONS

Chinese Office action dated Apr. 29, 2019.

* cited by examiner

COMPOSITION FOR FORMING ELECTRODE, ELECTRODE MANUFACTURED USING THE SAME AND SOLAR CELL

CROSS-REFERENCE TO RELATED APPLICATION

Korean Patent Application No. 10-2017-0033217, filed on Mar. 16, 2017, in the Korean Intellectual Property Office, and entitled: "Composition for Forming Electrode, Electrode Manufactured Using the Same and Solar Cell," is incorporated by reference herein in its entirety.

BACKGROUND

1. Field

Embodiments relate to a composition for forming an electrode, an electrode manufactured using the same, and a solar cell, and associated methods.

2. Description of the Related Art

Solar cells generate electrical energy using the photovoltaic effect of a p-n junction which converts photons of sunlight into electricity. In the solar cell, front and rear electrodes are formed on front and rear surfaces of a semiconductor substrate (semiconductor wafer) with the p-n junction, respectively. A photovoltaic effect of the p-n junction is induced by sunlight entering the substrate and electrons generated by the photovoltaic effect of the p-n junction provide an electric current to the outside through the electrodes.

SUMMARY

Embodiments are directed to a composition for forming an electrode for a solar cell, including a conductive powder, a glass fit, and an organic binder, the organic binder including a cellulose compound that includes a structural unit represented by Chemical Formula 1:

[Chemical Formula 1]

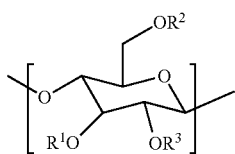

In Chemical Formula 1, $R^1$, $R^2$, and $R^3$ may independently be hydrogen, a substituted or unsubstituted C1 to C15 alkyl group, a substituted or unsubstituted C2 to C15 alkenyl group, a substituted or unsubstituted C3 to C20 cycloalkyl group, a substituted or unsubstituted C3 to C20 heterocycloalkyl group, a substituted or unsubstituted C3 to C20 aryl group, a substituted or unsubstituted C3 to C20 heteroaryl group, or a functional group represented by Chemical Formula 2. At least one of $R^1$, $R^2$, and $R^3$ may include a functional group represented by Chemical Formula 2,

[Chemical Formula 2]

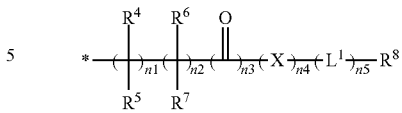

In Chemical Formula 2, $R^4$ to $R^7$ may independently be hydrogen, a hydroxy group, or a substituted or unsubstituted C1 to C15 alkyl group, or $R^5$ and $R^7$ may be linked with each other to form a fused ring, X may be oxygen or sulfur, $L^1$ may be a substituted or unsubstituted C1 to C15 alkylene group, n1 to n5 may independently be an integer ranging from 0 or 1, n1 to n5 may not simultaneously be 0, when n4 is 1, one or more of n1 to n3 may be 1, and $R^8$ may be represented by Chemical Formula 3-1 or Chemical Formula 3-2,

[Chemical Formula 3-1]

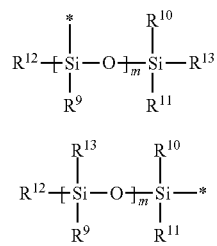

[Chemical Formula 3-2]

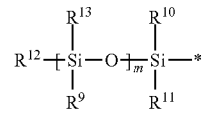

In Chemical Formula 3-1 and Chemical Formula 3-2, $R^9$ to $R^{13}$ are independently a substituted or unsubstituted C1 to C15 alkyl group, and m is an integer ranging from 1 to 100.

in Chemical Formula 2, n1, n2, n4, and n5 may each be 1, n3 may be 0, and $R^4$ may be a hydroxy group.

In Chemical Formula 2, n1, n2, n4, and n5 may each be 1, n3 may be 0, $R^4$ may be a hydroxy group, and $R^5$ and $R^7$ may be linked with each other to form a C3 to C10 cycloalkane.

In Chemical Formula 2, n2, n3, n4, and n5 may each be 1, n1 may be 0, and $R^6$ may be a substituted or unsubstituted C1 to C15 alkyl group.

In Chemical Formula 2, n3 and n5 may each be 1, and n1, n2, and n4 may each be 0.

The functional group represented by Chemical Formula 2 may be represented by one of Chemical Formula 2-1 to Chemical Formula 2-4:

[Chemical Formula 2-1]

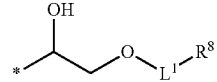

-continued

[Chemical Formula 2-2]

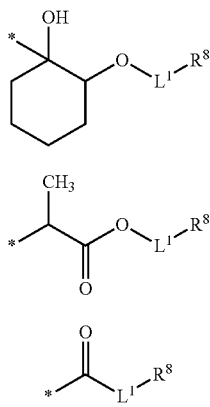

[Chemical Formula 2-3]

[Chemical Formula 2-4]

In Chemical Formula 2-1 to Chemical Formula 2-4,
$L^1$ may be a substituted or unsubstituted C1 to C15 alkylene group, and
$R^8$ may be represented by Chemical Formula 3-1 or 3-2,

[Chemical Formula 3-1]

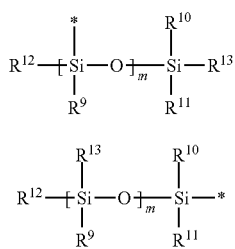

[Chemical Formula 3-2]

In Chemical Formula 3-1 and Chemical Formula 3-2,
$R^9$ to $R^{13}$ may independently be a substituted or unsubstituted C1 to C15 alkyl group, and
m may be an integer ranging from 1 to 100.

The cellulose compound may have a weight average molecular weight of about 5,000 g/mol to about 200,000 g/mol.

The composition may include about 60 wt % to about 95 wt % of the conductive powder; about 0.5 wt % to about 20 wt % of the glass frit; about 0.1 wt % to about 20 wt % of the organic binder; and a solvent.

The glass frit may include one or more of lead, tellurium, bismuth, lithium, phosphorus, germanium, gallium, cerium, iron, silicon, zinc, tungsten, magnesium, cesium, strontium, molybdenum, titanium, tin, indium, vanadium, barium, nickel, copper, sodium, potassium, arsenic, cobalt, zirconium, manganese, or aluminum.

The solvent may include one or more of methyl cellosolve, ethyl cellosolve, butyl cellosolve, aliphatic alcohol, α-terpineol, β-terpineol, dihydro-terpineol, ethylene glycol, ethylene glycol mono butyl ether, butyl cellosolve acetate, or 2,2,4-trimethyl-1,3-pentanediol isobutyrate.

The composition may further include one or more of a surface-treatment agent, a dispersing agent, thixotropic agent, a viscosity stabilizer, a plasticizer, an antifoaming agent, a pigment, an ultraviolet stabilizer, an antioxidant, or a coupling agent.

Embodiments are also directed to a solar cell electrode manufactured using the composition according to an embodiment.

Embodiments are also directed to a solar cell including the electrode according to an embodiment.

The solar cell may have a passivated emitter and rear cell structure.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
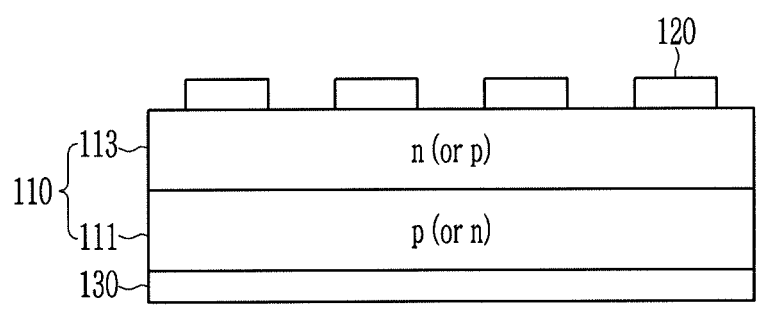
FIG. 1 illustrates a schematic view showing the structure of a solar cell according to an embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art. In the drawing figures, the dimensions of layers and regions may be exaggerated for clarity of illustration. Like reference numerals refer to like elements throughout.

It will be understood that when an element such as a layer, film, region, or substrate is referred to as being "on" another element, it can be directly on the other element or intervening elements may also be present. In contrast, when an element is referred to as being "directly on" another element, there are no intervening elements present.

As used herein, when specific definition is not otherwise provided, "substituted" refers to replacement of at least one hydrogen by a substituent selected from a halogen (F, Cl, Br, or I), a hydroxy group, a C1 to C20 alkoxy group, a nitro group, a cyano group, an amino group, an imino group, an azido group, an amidino group, a hydrazino group, a hydrazono group, a carbonyl group, a carbamyl group, a thiol group, an ester group, an ether group, a carboxyl group or a salt thereof, a sulfonic acid group or a salt thereof, a phosphoric acid group or a salt thereof, a C1 to C20 alkyl group, a C2 to C20 alkenyl group, a C2 to C20 alkynyl group, a C6 to C30 aryl group, a C3 to C20 cycloalkyl group, a C3 to C20 cycloalkenyl group, a C3 to C20 cycloalkynyl group, a C2 to C20 heterocycloalkyl group, a C2 to C20 heterocycloalkenyl group, a C2 to C20 heterocycloalkynyl group, a C3 to C30 heteroaryl group, or a combination thereof.

As used herein, when specific definition is not otherwise provided, the term "hetero" may refer to one substituted with at least one hetero atom of N, O, S, and P, instead of at least one C in a cyclic substituent.

As used herein, when specific definition is not otherwise provided, "*" indicates a point where the same or different atom or chemical formula is linked.

A composition for forming an electrode according to an embodiment includes a conductive powder, a glass fit, and an organic binder. In an implementation, the composition includes the conductive powder, the glass frit, the organic binder, and a solvent.

Hereinafter, each component of the composition for forming an electrode is described in detail.

The composition for forming an electrode may use a metal powder as the conductive powder. The metal powder may include, for example, at least one metal selected from silver (Ag), gold (Au), palladium (Pd), platinum (Pt), ruthenium (Ru), rhodium (Rh), osmium (Os), iridium (Ir), rhenium (Re), titanium (Ti), niobium (Nb), tantalum (Ta), aluminum (Al), copper (Cu), nickel (Ni), molybdenum (Mo), vanadium (V), zinc (Zn), magnesium (Mg), yttrium (Y), cobalt (Co), zirconium (Zr), iron (Fe), tungsten (W), tin (Sn), chromium (Cr), and manganese (Mn), but is not limited thereto.

The particle size of the conductive powder may be a nanometer or micrometer scale. For example, the conductive powder may have a particle size of dozens to several hundred nanometers, or several to dozens of micrometers. In other embodiments, the conductive powder may be a mixture of two or more types of silver powders having different particle sizes.

The conductive powder may have a particle shape of, for example, a spherical shape, a sheet-shape, or amorphous. The conductive powder may have an average particle diameter (D50) of, for example, about 0.1 µm to about 10 µm, for example about 0.5 µm to about 5 µm. The average particle diameter may be measured using, for example, Model 1064D (CILAS Co., Ltd.) equipment after dispersing the conductive powder in isopropyl alcohol (IPA) at room temperature (about 20° C. to about 25° C.) for 3 minutes via ultrasonication. Within these ranges, the composition may provide low contact resistance and low line resistance.

The conductive powder may be present in an amount of, for example, about 60 wt % to about 95 wt %, for example about 70 wt % to about 90 wt % based on a total amount (100 wt %) of the composition for forming an electrode for a solar cell. Within these ranges, deterioration in conversion efficiency due to an increase in resistance may be prevented and hard formation of paste caused by a relative decrease of an organic vehicle may also be prevented.

The glass frit may serve to enhance adhesion force between the conductive powder and the wafer or the substrate and to form silver crystal grains in an emitter region by etching an anti-reflection layer and melting the conductive powder so as to reduce contact resistance during a firing process of the composition for forming an electrode for a solar cell. Further, during the sintering process, the glass frit may be softened and may decrease the firing temperature.

When the area of the solar cell is increased in order to improve solar cell efficiency, there is a possibility that contact resistance of the solar cell may be increased. Thus, it is desirable to minimize the influence on the p-n junction while minimizing series resistance. In addition, the firing temperature may vary within a broad range with increasing use of various wafers having different sheet resistances. It is desirable for the glass frit to secure thermal stability to withstand a wide range of a firing temperature.

The glass fit may be, for example, one or more of lead glass fit and non-lead glass frit.

The glass frit may include, for example, at least one metal element. The glass frit may include, for example, one or more selected from lead (Pb), tellurium (Te), bismuth (Bi), lithium (Li), phosphorus (P), germanium (Ge), gallium (Ga), cerium (Ce), iron (Fe), silicon (Si), zinc (Zn), tungsten (W), magnesium (Mg), cesium (Cs), strontium (Sr), molybdenum (Mo), titanium (Ti), tin (Sn), indium (In), vanadium (V), barium (Ba), nickel (Ni), copper (Cu), sodium (Na), potassium (K), arsenic (As), cobalt (Co), zirconium (Zr), manganese (Mn), and aluminum (Al).

The glass frit may be prepared from oxides of the metal elements by a suitable method. For example, the metal oxides may be obtained by mixing the oxides of the metal elements in a predetermined ratio, melting the mixture, quenching the resultant, and then pulverizing the quenched product. The process of mixing may be performed using, for example, a ball mill or a planetary mill. The process of melting may be performed at, for example, about 700° C. to about 1300° C. and the quenching may be performed at, for example, room temperature (about 20° C. to about 25° C.). The process of pulverizing may be performed using, for example, a disk mill or a planetary mill without limitation.

The glass fit may have an average particle diameter (D50) of, for example, about 0.1 µm to about 10 and may be present in an amount of, for example, about 0.5 wt % to about 20 wt % based on a total amount (100 wt %) of the composition for forming an electrode for a solar cell. Within these ranges, the glass frit may secure excellent adhesion strength of a solar cell electrode while not deteriorating electrical characteristics of an electrode.

The glass frit may have, for example, a spherical shape or an amorphous shape. In an embodiment, two different kinds of glass fits having different transition temperatures may be used. For example, a first glass frit having a transition temperature ranging from greater than or equal to about 200° C. to less than or equal to about 350° C. and a second glass fit having a transition temperature ranging from greater than about 350° C. to less than or equal to about 550° C. may be mixed.

According to the present example embodiment, a paste composition for forming a solar cell electrode includes a cellulose compound that includes a structural unit represented by Chemical Formula 1 as an organic binder.

[Chemical Formula 1]

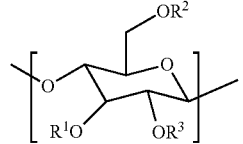

In an example embodiment, in Chemical Formula 1, $R^1$, $R^2$, and $R^3$ are independently hydrogen, a substituted or unsubstituted C1 to C15 alkyl group, a substituted or unsubstituted C2 to C15 alkenyl group, a substituted or unsubstituted C3 to C20 cycloalkyl group, a substituted or unsubstituted C3 to C20 heterocycloalkyl group, a substituted or unsubstituted C3 to C20 aryl group, a substituted or unsubstituted C3 to C20 heteroaryl group, or a functional group represented by Chemical Formula 2.

In an implementation, at least one of $R^1$, $R^2$, and $R^3$ is or includes a functional group represented by Chemical Formula 2,

[Chemical Formula 2]

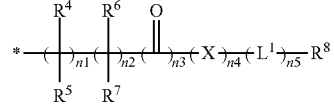

wherein, in Chemical Formula 2, $R^4$ to $R^7$ are independently hydrogen, a hydroxy group, or a substituted or unsubstituted C1 to C15 alkyl group, or $R^5$ and $R^7$ may be linked with each other to form a fused ring, X is oxygen or sulfur, $L^1$ is a substituted or unsubstituted C1 to C15 alkylene group, n1 to n5 are independently 0 or 1, provided that n1 to n5 are not simultaneously 0, and, when n4 is an integer of 1, one or more of n1 to n3 is an integer of 1, and $R^8$ is represented by Chemical Formula 3-1 or 3-2,

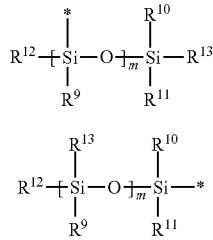

[Chemical Formula 3-1]

[Chemical Formula 3-2]

wherein, in Chemical Formulae 3-1 and 3-2, $R^9$ to $R^{13}$ are independently a substituted or unsubstituted C1 to C15 alkyl group, and m is an integer ranging from 1 to 100.

According to the present example embodiment, an organic binder may include a compound obtained by modifying an ethyl cellulose structural unit including a hydroxy group, for example, modifying a hydroxy group in the ethyl cellulose structural unit with a functional group such as an epoxy group, an acrylate group, and/or a carboxyl group.

For example, a silicone compound having a functional group (an epoxy group, an acrylate group, and/or a carboxyl group) having reactivity with the hydroxy group in the molecular structure of the cellulose and/or cellulose derivative may be used to synthesize the cellulose and/or cellulose derivative modified with the silicone compound. This synthesized cellulose and/or cellulose derivative modified with the silicone compound (the organic binder) may provide a cellulose moiety having affinity for an organic composition (a solvent, other additives, and the like) and a silicon moiety having affinity for a conductive powder, a glass frit, and the like among paste components, and thus may ultimately improve dispersibility of a paste.

In addition, the organic binder may prevent viscosity deterioration, phase-separation, and the like in a long term and have an effect on storage stability. Furthermore, the organic binder may surround a conductive powder in the paste during a screen printing process and a firing process. A carbon ring of the cellulose and/or cellulose derivative may be disconnected by heat at a high temperature (for example, at most about 900° C.) and leave an Si component. The Si component may improve adhesion between an electrode and an Si-wafer.

According to an embodiment, a paste composition for a solar cell electrode including the organic binder may provide improved printing characteristics (for example, one or more of width decrease, a thickness increase, an aspect ratio increase, and the like), and thus may help provide excellent electrical resistivity characteristics and realize a high aspect ratio due to excellent printability, and thus provide an electrode pattern with high resolution.

For example, when the hydroxy group in the ethyl cellulose structural unit is modified with an epoxy group, a structural unit represented by Chemical Formula 1 is a functional group represented by Chemical Formula 2 (n1, n2, n4, and n5 are independently an integer of 1, n3 is an integer of 0, and $R^4$ is a hydroxy group). For example, the functional group represented by Chemical Formula 2 may be represented by one of Chemical Formula 2-1 to Chemical Formula 2-4.

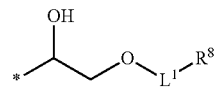

[Chemical Formula 2-1]

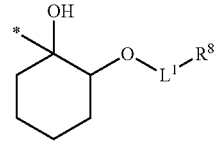

[Chemical Formula 2-2]

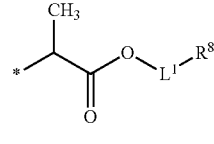

[Chemical Formula 2-3]

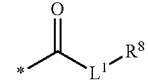

[Chemical Formula 2-4]

In Chemical Formulae 2-1 to 2-4, $L^1$ is a substituted or unsubstituted C1 to C15 alkylene group, and $R^8$ is represented by Chemical Formula 3-1 or Chemical Formula 3-2.

The organic binder before the modification may include about 5 to about 30, for example, about 10 to about 20 ethyl cellulose structural units including a hydroxy group and be an oligomer or a polymer having a polydispersity index (PDI) of about 7 to about 10.

The cellulose compound (modified organic binder) may have, for example, a weight average molecular weight (Mw) of about 5,000 g/mol to about 200,000 g/mol.

When the cellulose compound is used as the organic binder, a solar cell having improved efficiency may be provided despite firing at a lower firing temperature than a firing temperature for manufacturing a solar cell. In addition, when a molecular weight of the organic binder is reduced, an amount of the organic binder may be increased in the composition for forming an electrode, and accordingly, the organic binder may improve a flow behavior and thixotropy of the composition for forming an electrode and thus printability. In an implementation, the composition for forming an electrode including the organic binder may be used to form an electrode in a solar cell having a PERC (passivated emitter and rear cell) structure. The PERC (passivated emitter and rear cell) structured solar cell will be described below.

The composition for forming an electrode for a solar cell may include about 60 wt % to about 95 wt % of the conductive powder, about 0.5 wt % to about 20 wt % of the glass fit, and about 0.1 wt % to about 20 wt % of the organic binder, based on a total amount of the composition for forming an electrode for a solar cell. The composition may further include an amount of a solvent that will be described below. Within the ranges, the composition for forming an electrode for a solar cell may have appropriate viscosity and be prevented from adherence deterioration to the substrate, and may also have high resistance due to unsmooth decomposition of the organic binder during firing and prevent an electrode from being cracked, being opened, having a pin hole, and the like during the firing.

The solvent may have a boiling point of, for example, about 100° C. or greater and may be or include, for example, methyl cellosolve, ethyl cellosolve, butyl cellosolve, an aliphatic alcohol, α-terpineol, β-terpineol, dihydro-terpineol, ethylene glycol, ethylene glycol mono butyl ether, butyl cellosolve acetate, 2,2,4-trimethyl-1,3-pentanediol isobutyrate (Texanol), which may be used alone or in a combination of two or more.

In an implementation, the solvent may be present in a balance amount based on the composition for forming an electrode for a solar cell, and may make up, for example about 1 wt % to about 30 wt % based on a total amount (100 wt %) of the composition for forming an electrode for a solar cell. Within the ranges, sufficient adhesion strength and excellent print characteristics may be secured.

The composition for forming an electrode for a solar cell may further include additives, for example, to enhance flow properties, process properties, and stability. The additives may include, for example, a surface-treatment agent, a dispersing agent, a thixotropic agent, a viscosity stabilizer, an antifoaming agent, a pigment, an ultraviolet (UV) stabilizer, an antioxidant, and a coupling agent. These additives may be used alone or as mixtures thereof.

The additives may be present in an amount of, for example, about 0.1 wt % to about 5 wt % based on a total amount (100 wt %) of the composition for forming an electrode for a solar cell. The amount of the additive may be selected considering, for example, print characteristics, dispersibility, and storage stability of the composition for forming an electrode for a solar cell.

Another embodiment provides an electrode formed from the composition for forming an electrode for a solar cell.

In addition, another embodiment provides a solar cell including the electrode.

Referring to FIG. 1, a solar cell according to an embodiment is explained. FIG. 1 is a schematic view showing the structure of the solar cell according to an embodiment.

DESCRIPTION OF SYMBOLS

| 100, 200: solar cell | 120, 220: front electrode |
| 130, 230: rear electrode | 111, 211: p layer (or n layer) |
| 113, 213: n layer (or p layer) | 110, 210: substrate |
| 230: rear passivation layer | 232: hole |

Referring to FIG. 1, a solar cell 100 according to an example embodiment includes a front electrode 120 and a rear electrode 130, which may be formed by, for example, printing the composition for forming an electrode according to an embodiment, and firing the same on a substrate 110 including a p layer (or an n layer) 111 and an n layer (or a p layer) 113 as an emitter.

For example, a prior preparation step for the rear electrode may be performed by printing the electrode composition on the rear surface of the wafer and dried at about 200° C. to about 400° C. for about 10 seconds to about 60 seconds and drying it. In addition, a prior preparation step for the front electrode may be performed by printing the electrode composition on the front surface of the wafer and drying it. Then, the front electrode 120 and the rear electrode 130 may be fired at, for example, about 400° C. to about 1,000° C., for example, about 600° C. to about 950° C., for, for example, about 30 seconds to about 240 seconds.

Figure 2:
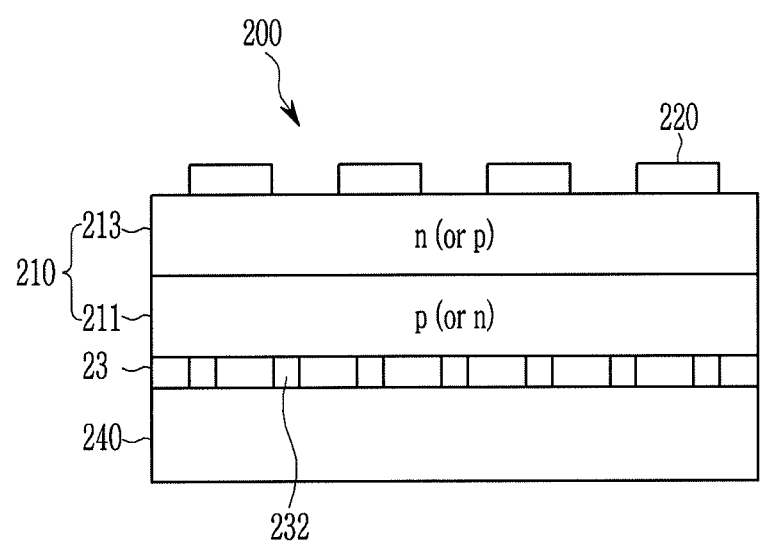
FIG. 2 illustrates a schematic view showing a solar cell having a PERC (passivated emitter and rear cell) structure according to another embodiment.

FIG. 2 is a schematic view showing a solar cell having a PERC (Passivated emitter and rear cell) structure according to another example embodiment.

Referring to FIG. 2, in a solar cell 200 according to an example embodiment, a front electrode 220 and a rear electrode 230 may be manufactured by, for example, forming a rear passivation layer 230 on a substrate 210 including a p layer (or an n layer) 211 and an n layer (or a p layer) 213 as an emitter, a hole 232 penetrating the rear passivation layer 230, and then, printing the composition for forming an electrode and firing it. The rear passivation layer 230 may be formed of a dielectric material capable of providing an electrical contact between the substrate 210 and the rear electrode 240. This dielectric material may be, for example, an aluminum oxide, a silicon oxide, a silicon nitride, or a mixture thereof. The rear passivation layer 230 may reflect light entering the substrate 210 and thus reduce light absorbed in the rear electrode 240 and resultantly, increase an amount of a current produced thereby.

For example, the composition for forming an electrode may be printing-coated on the rear passivation layer 230 of the substrate 210 and dried at a temperature of, for example, about 200° C. to about 400° C. for, for example, about 10 seconds to about 60 seconds as a prestep for manufacturing a rear electrode. In addition, the composition for forming an electrode may be printed on the front surface of the substrate and dried as the prestep for manufacturing a front electrode. Subsequently, the coated substrates may be fired at, for example, about 400° C. to about 900° C., for example, about 600° C. to about 900° C. for, for example, about 30 seconds to 240 seconds to manufacture the front electrode 220 and the rear electrode 240.

The following Examples and Comparative Examples are provided in order to highlight characteristics of one or more embodiments, but it will be understood that the Examples and Comparative Examples are not to be construed as limiting the scope of the embodiments, nor are the Comparative Examples to be construed as being outside the scope of the embodiments. Further, it will be understood that the embodiments are not limited to the particular details described in the Examples and Comparative Examples.

Synthesis of Organic Binder

Synthesis Example 1

50 g of ethyl cellulose (Mw=40,000, Dow Chemical Co.) and a modified silicone compound having a methacryl group at the terminal end (methacryl-modified silicone, Shin-Etsu Chemical Co., Ltd.) in an amount of 3 equivalents based on 1 equivalent of ethyl cellulose were added to dimethyl sulfoxide (twice as much by weight as a total weight of monomers) in a round-bottomed flask equipped with a condenser under a nitrogen atmosphere, and a temperature in the flask was increased up to 60° C. while the mixture was sufficiently stirred. After taking out a predetermined amount of the dimethyl sulfoxide, AIBN (azobisisobutyronitrile) (0.1 eq based on a total mol of monomer) was completely dissolved therein, the solution was slowly added in a dropwise fashion to the flask through a dropping funnel to perform a radical reaction. When the addition was complete, the reaction was continued at 60° C. under a nitrogen atmosphere for 24 hours. When the reaction was complete, the resultant was three times repetitively precipitated in n-hexane to remove non-reactants and impurities and filtered. The obtained precipitate was dried to obtain Polymer 1 having a weight average molecular weight (Mw) of 50,000 g/mol.

Synthesis Example 2

Polymer 2 having a weight average molecular weight (Mw) of 55,000 g/mol was obtained according to the same method as Synthesis Example 1 except for using a modified silicone compound having an epoxy group at the terminal end (epoxy-modified silicone, Shin-Etsu Chemical Co., Ltd.) instead of the modified silicone compound having a methacryl group at the terminal end and tin(II) 2-ethyl-hexanoate instead of AIBN.

Synthesis Example 3

Polymer 3 having a weight average molecular weight (Mw) of 47,000 g/mol was obtained according to the same method as Example 1 except for using methyl methacrylate instead of the modified silicone compound having a methacryl group at the terminal end.

Preparation of Composition for Forming Electrode

Example 1

0.5 wt % of an organic binder (Polymer 1) according to Synthesis Example 1 was sufficiently dissolved in 7.5 wt % of Texanol (Eastman Chemical Company) as a solvent at 60° C., and 88.5 wt % of a spherically-shaped silver powder having an average particle diameter of 2.0 μm (AG-5-11F, Dowa Hightech Co. Ltd.), 3 wt % of a Bi—Te-based non-lead glass frit powder having an average particle diameter of 1.0 μm (ABT-1, Asahi Glass Co., Ltd.), 0.2 wt % of a dispersing agent (BYK-102, BYK-Chemie), and 0.3 wt % of a thixotropic agent (Thixatrol ST, Elementis Co.) were added thereto and then, mixed and dispersed therein with a 3 roll miller to prepare a composition for forming an electrode for a solar cell.

Example 2

A composition for forming an electrode for a solar cell was prepared according to the same method as Example 1 except for using Polymer 2 instead of the organic binder of Example 1.

Comparative Example 1

A composition for forming an electrode for a solar cell was prepared according to the same method as Example 1 except for using Polymer 3 instead of the organic binder of Example 1.

Comparative Example 2

A composition for forming an electrode for a solar cell was prepared according to the same method as Example 1 except for using ethyl cellulose (STD4, Mw=40,000, Dow Chemical Company) instead of the organic binder of Example 1.

Comparative Example 3

0.5 wt % of ethyl cellulose (STD4, Mw=40,000, Dow Chemical Company) was sufficiently dissolved in 7.5 wt % of Texanol (Eastman Chemical Company) as a solvent at 60° C., and 88.5 wt % of a spherically-shaped silver powder having an average particle diameter of 2.0 μm (AG-5-11F, Dowa Hightech Co. Ltd.), 3 wt % of a Bi—Te-based non-lead glass frit powder having an average particle diameter of 1.0 μm (ABT-1, Asahi Glass Co., Ltd.), 0.2 wt % of a dispersing agent (BYK-Chemie, BYK-102), 0.1 wt % of a thixotropic agent (Thixatrol ST, Elementis Co.), and 0.2 wt % of a modified silicone compound having a methacryl group at the terminal end (methacryl-modified silicone, Shin-Etsu Co., Ltd.) were added thereto and then, mixed and dispersed therein with a 3 roll miller to prepare a composition for forming an electrode for a solar cell.

Manufacture of Cells

The compositions for forming an electrode according to Examples 1 and 2 and Comparative Examples 1 to 3 were respectively screen-coated on the front surface of p-type polysilicon wafers for PERC (REC Solar Pte, Ltd. Singapore) by using a screen mask to print an electrode pattern (a finger bar) and dried by using an infrared ray drying furnace. Subsequently, the compositions for forming an electrode including aluminum (RX-8252X-2, Ruxing Group Co., Ltd.) were respectively printed on the rear surface of the wafers and then, dried at a temperature ranging from 200 to 400° C. through a belt-type furnace for 30 seconds, and then, fired at 400° C. to 800° C. for 40 seconds in the belt-type furnace to manufacture solar cells.

(Screen mask: SUS325 type/Emulsion thickness: 15 μm/Finger bar: a line width of 45 μm, the number of 80)

Evaluation

An EL tester (MV Tech Inc.) was used to count the number of line openings in order to check whether the front electrodes according to Examples 1 and 2 and Comparative Examples 1 to 3 were disconnected or not, a VK equipment (VK9710, Keyence Corp.) was used to measure a line width and a thickness of electrode lines, and a solar cell efficiency-measuring equipment (CT-801, Pasan Measurement Systems) was used to measure efficiency. The results are shown in Table 1.

TABLE 1

|  | Example 1 | Example 2 | Comparative Example 1 | Comparative Example 2 | Comparative Example 3 |
| --- | --- | --- | --- | --- | --- |
| Line width after firing (μm) | 61 | 62 | 68 | 63 | 72 |
| Thickness after firing (μm) | 16 | 17 | 12 | 14 | 11 |
| Aspect ratio (thickness/line width) | 0.26 | 0.27 | 0.18 | 0.22 | 0.15 |
| Printability (the number of disconnected lines) | <5 | <5 | >10 | >5 | >20 |
| Efficiency (%) | 17.7 | 17.9 | 16.6 | 17.2 | 14.9 |

Referring to Table 1, the electrodes manufactured by respectively using the compositions for forming an electrode for a solar cell according to Examples 1 and 2 realized a fine line width and showed a high aspect ratio, excellent printability, and a much lower rate of generating a disconnected line compared with the electrodes manufactured by respectively using the compositions for forming an electrode for a solar cell according to Comparative Examples 1 and 3. In addition, cells including the electrodes manufactured by respectively using the compositions for forming an electrode for a solar cell according to Examples 1 and 2 showed significantly improved efficiency compared with cells including the electrodes manufactured by respectively using the compositions for forming an electrode for a solar cell according to Comparative Examples 1 and 3.

By way of summation and review, the electrodes of the solar cell may be formed with predetermined patterns on a surface of a substrate by a composition for forming an electrode, and patterning and firing the same.

Conversion efficiency of a solar cell may be improved by improving contact properties of electrodes with the substrate, and thus minimizing contact resistance ($R_c$) and series resistance ($R_s$), or by adjusting pattern line widths of a screen mask with an organic material to be smaller, and thus forming fine lines and increasing a short circuit current ($I_{sc}$). However, the method of reducing line widths of the electrode pattern with the screen mask may lead to increasing series resistance ($R_s$) and deteriorating continuous printability of a fine pattern.

The electrode composition may include an organic vehicle to impart suitable viscosity and rheological characteristics for printing, and the organic vehicle generally includes an organic binder and a solvent. The amount of the organic binder may be increased or a polymer having high molecular weight may be used in order to increase dispersibility and storage stability. However, when the amount of the organic binder is increased, resistance may also be increased during formation of an electrode, and when the organic binder having high molecular weight is used, a tailing phenomenon and a printing defect may occur due to increased viscosity even at a high shear rate.

In further detail, a cellulose binder and an acryl-based binder may be applied as an organic binder. Ethyl cellulose may be used, for example, as the organic binder. For example, an ethyl cellulose binder resin (e.g., Ethocel STD series, DOW Chemical Company) may be used through simple addition without modifying its chemical structure. Various additives (for example, a thickener, a plasticizer, a dispersing agent, and the like) may be used to improve printability, dispersibility, storage stability, and the like, but these may increase a residue after firing and the like, and/or may increase resistance during manufacturing an electrode for a solar cell. Furthermore, if an acryl-based binder is used, tailing during screen printing may occur.

As described above, embodiments may provide a composition for forming an electrode having an improved adhesion force. Embodiments may provide a composition that uses a modified cellulose organic binder. A composition according to embodiments may exhibit improved print characteristics, dispersibility, and storage stability.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A composition for forming an electrode for a solar cell, comprising:
a conductive powder, a glass fit, and an organic binder, the organic binder including a cellulose compound that includes a structural unit represented by Chemical Formula 1:

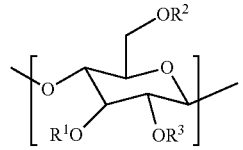

[Chemical Formula 1]

wherein, in Chemical Formula 1,
$R^1$, $R^2$, and $R^3$ are independently hydrogen, a substituted or unsubstituted C1 to C15 alkyl group, a substituted or unsubstituted C2 to C15 alkenyl group, a substituted or unsubstituted C3 to C20 cycloalkyl group, a substituted or unsubstituted C3 to C20 heterocycloalkyl group, a substituted or unsubstituted C3 to C20 aryl group, a substituted or unsubstituted C3 to C20 heteroaryl group, or a functional group represented by Chemical Formula 2,
provided that at least one of $R^1$, $R^2$, and $R^3$ includes a functional group represented by Chemical Formula 2,

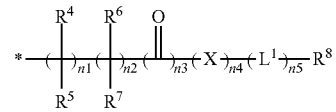

[Chemical Formula 2]

wherein, in Chemical Formula 2,
$R^4$ to $R^7$ are independently hydrogen, a hydroxy group, or a substituted or unsubstituted C1 to C15 alkyl group, or $R^5$ and $R^7$ are linked with each other to form a fused ring,
X is oxygen or sulfur,
$L^1$ is a substituted or unsubstituted C1 to C15 alkylene group,
n1 to n5 are independently 0 or 1, provided that n1 to n5 are not simultaneously 0, and provided that, when n4 is 1, one or more of n1 to n3 is 1, and
$R^8$ is represented by Chemical Formula 3-2,

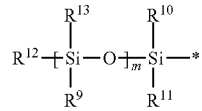

[Chemical Formula 3-2]

wherein, in Chemical Formula 3-2, $R^9$ to $R^{13}$ are independently a substituted or unsubstituted C1 to C15 alkyl group, and m is an integer ranging from 1 to 100.

2. The composition as claimed in claim 1, wherein the cellulose compound has a weight average molecular weight of about 5,000 g/mol to about 200,000 g/mol.

3. The composition as claimed in claim 1, wherein the composition includes about 60 wt % to about 95 wt % of the conductive powder; about 0.5 wt % to about 20 wt % of the glass fit; about 0.1 wt % to about 20 wt % of the organic binder; and a solvent.

4. The composition as claimed in claim 1, wherein the glass fit includes one or more of lead, tellurium, bismuth, lithium, phosphorus, germanium, gallium, cerium, iron, silicon, zinc, tungsten, magnesium, cesium, strontium, molybdenum, titanium, tin, indium, vanadium, barium, nickel, copper, sodium, potassium, arsenic, cobalt, zirconium, manganese, or aluminum.

5. The composition as claimed in claim 1, wherein the solvent includes one or more of methyl cellosolve, ethyl cellosolve, butyl cellosolve, aliphatic alcohol, α-terpineol, β-terpineol, dihydro-terpineol, ethylene glycol, ethylene glycol mono butyl ether, butyl cellosolve acetate, or 2,2,4-trimethyl-1,3-pentanediol isobutyrate.

6. The composition as claimed in claim 1, further comprising one or more of a surface-treatment agent, a dispersing agent, thixotropic agent, a viscosity stabilizer, a plasticizer, an antifoaming agent, a pigment, an ultraviolet stabilizer, an antioxidant, or a coupling agent.

7. A solar cell electrode manufactured using the composition as claimed in claim 1.

8. A solar cell comprising the electrode as claimed in claim 7.

9. The solar cell as claimed in claim 8, wherein the solar cell has a passivated emitter and rear cell structure.

10. The composition as claimed in claim 1, wherein, in Chemical Formula 2, n1, n2, n4, and n5 are each 1, n3 is 0, and $R^4$ is a hydroxy group.

11. The composition as claimed in claim 1, wherein, in Chemical Formula 2, n1, n2, n4, and n5 are each 1, n3 is 0, $R^4$ is a hydroxy group, and $R^5$ and $R^7$ are linked with each other to form a C3 to C10 cycloalkane.

12. The composition as claimed in claim 1, wherein, in Chemical Formula 2, n2, n3, n4, and n5 are each 1, n1 is 0, and $R^6$ is a substituted or unsubstituted C1 to C15 alkyl group.

13. The composition as claimed in claim 1, wherein, in Chemical Formula 2, n3 and n5 are each 1, and n1, n2, and n4 are each 0.

14. The composition as claimed in claim 1, wherein the functional group represented by Chemical Formula 2 is represented by one of Chemical Formula 2-1 to Chemical Formula 2-4:

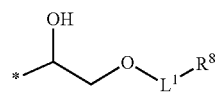

[Chemical Formula 2-1]

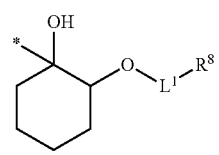

[Chemical Formula 2-2]

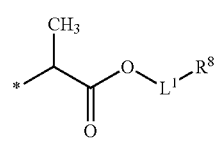

[Chemical Formula 2-3]

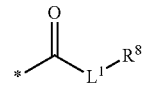

[Chemical Formula 2-4]

wherein, in Chemical Formula 2-1 to Chemical Formula 2-4, $L^1$ is a substituted or unsubstituted C1 to C15 alkylene group, and $R^8$ is represented by Chemical Formula

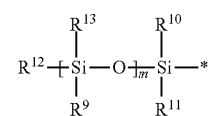

[Chemical Formula 3-2]

wherein, in Chemical Formula 3-2, $R^9$ to $R^{13}$ are independently a substituted or unsubstituted C1 to C15 alkyl group, and m is an integer ranging from 1 to 100.

* * * * *